United States Patent [19]

Wagner et al.

[11] 4,195,896
[45] Apr. 1, 1980

[54] PROGRAM PLUG

[75] Inventors: George G. Wagner, Woodridge; Thomas W. Jordan, Berkeley, both of Ill.

[73] Assignee: Wescom, Inc., Downers Grove, Ill.

[21] Appl. No.: 964,660

[22] Filed: Nov. 29, 1978

Related U.S. Application Data

[63] Continuation of Ser. No. 853,810, Nov. 21, 1977, abandoned.

[51] Int. Cl.² ............................................. H05K 1/12
[52] U.S. Cl. .............................. 339/18 B; 339/150 B; 339/17 C; 361/352; 361/415
[58] Field of Search ............... 339/150 B, 17 C, 18 R, 339/18 B, 18 G, 19, 193 P; 361/352, 397, 400, 401, 409, 410, 413, 415

[56] References Cited

U.S. PATENT DOCUMENTS

| | | | |
|---|---|---|---|
| 3,335,327 | 8/1967 | Damon | 361/401 |
| 3,644,792 | 2/1972 | Fields | 361/409 |
| 3,902,153 | 8/1975 | Norozny | 339/17 C |
| 3,923,359 | 12/1975 | Newsam | 361/409 |
| 3,935,372 | 1/1976 | Triplett | 339/18 C |

Primary Examiner—Gerald P. Tolin
Attorney, Agent, or Firm—Leydig, Voit, Osann, Mayer & Holt, Ltd.

[57] ABSTRACT

A program plug formed by a circuit board with interconnected sockets which engage conventional wire-wrap posts on the back panel of a circuit shelf to provide a convenient, accurate temporary interconnection to facilitate circuit testing and expansion.

2 Claims, 5 Drawing Figures

PROGRAM PLUG

This is a continuation of application Ser. No. 853,810, filed Nov. 21, 1977, now abandoned.

BACKGROUND OF THE INVENTION

This invention relates generally to interconnecting circuit cards contained in a circuit card enclosure and more particularly concerns an interconnection device or program plug for temporarily interconnecting the circuit cards contained in the enclosure.

In the telephone industry, as well as the electronic industry generally, electronic systems for performing complex electronic functions are often built up by use of a number of circuit card enclosures or shelves each of which contains a number of removable individual circuit cards.

Each circuit card includes the necessary components, resistors, capacitors, transistors and the like, and printed circuitry to provide a particular electronic function. A number of functions can be provided by inserting a number of cards in a shelf and electrically interconnecting the cards contained within the shelf.

In order to interconnect the cards, each card generally has a connector attached to one of its edges. The card connector has a number of separate conductive pins. The shelf has attached to its back panel a number of mating shelf connectors with separate mating receptacles for the card connector pins. Each separate mating receptacle of the shelf connector extends through the back panel and terminates in an elongated binding post to provide an array of binding posts. The binding posts of the circuit enclosure are elongated and rectangular in cross section so that each post has squared corners running along its length.

Card guides within the shelf direct the card connectors into engagement with the shelf connectors when the card is inserted into the shelf so that the card connector pins mate with the shelf connector receptacles to form a conductive path from the card circuitry through the pins to the back panel binding posts. The card guides also hold the cards in place within the enclosure.

Interconnecting the binding posts at the back panel determines the shelf's functional configuration and allows the designer to customize the particular shelf so that it performs the desired electronic function.

Generally the interconnection of the binding posts at the back panel is done by wrapping wires on each post so that the posts are connected by means of the wrapped wire. Wire wrapping is done by twisting a length of wire around each post generally by means of a tool specifically designed for the purpose. Wire wrapping on a post is a semi-permanent connection because the wire engages the squared corners of the posts and deforms the corner so that mechanical as well as the electrical integrity of the connection is assured. Such connections can only be removed with difficulty.

In the telephone industry there is often the need for a temporary back panel interconnection. Such connections are often desirable during installation of a system when a particular function is used during the initial start-up procedure. Also during testing and maintenance, certain temporary connections may be useful in order to determine at what capability the system is operating. Moreover, it is sometimes desired to reconfigure the system in certain predictable ways to provide for ordinary growth or the addition of capabilities to the system.

If wire wrapping is used for these temporary connections, there is the risk that when the connection is changed, the binding posts may be broken. Also, changing such wire wrapped connections is time consuming and, of course, there exists the possibility of human error in making point-to-point interconnections between binding posts.

A primary object of the invention is to provide a program plug for making temporary interconnections on the back panel of the circuit shelf.

A further object of the invention is to provide a program plug for interconnecting back panel binding posts without running the risk of breaking those binding posts.

Another object of the invention is to provide a program plug which is quick and easy to install and which eliminates the possibility of human error in making back panel interconnection.

Other objects and advantages of the invention will become apparent upon reading the following detailed description, and upon reference to the drawings, in which.

While the invention will be described in connection with a preferred embodiment, it will be understood that we do not intend to limit the invention to that embodiment. On the contrary, we intend to cover all alternatives, modifications and equivalents as may be included within the spirit and scope of the invention as defined by the appended claims.

Figure 1:
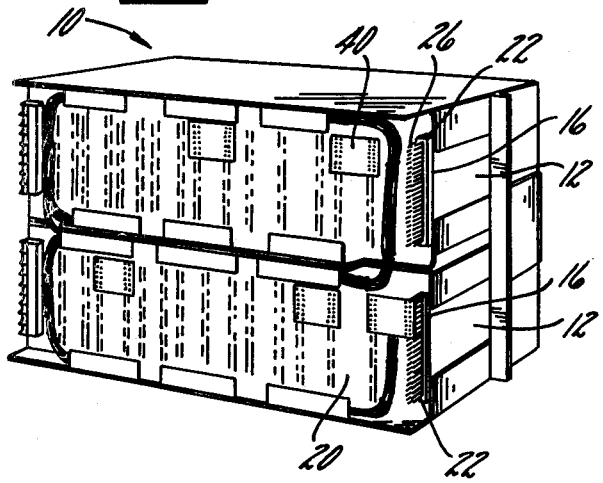
FIG. 1 is a perspective view of a circuit card shelf with a program plug embodying the present invention connected to the back panel binding posts of the shelf.

Turning to the drawings, FIG. 1 shows a circuit card enclosure or shelf 10 which contains a number of removable circuit cards 12. The circuit cards consist of a printed circuit board with various electronic components, such as resistors, transistors, capacitors and the like mounted on one side. A connector 16 having a series of conductive pins (not shown) is attached to one edge of the circuit card 12.

Each circuit card 12 may provide for one or more electrical functions. The conductive pins of connector 16 provide for the electrical functions' inputs and outputs from the card as well as supply power inputs for the circuit card 12.

In order to build up a complex system of circuit functions, it is necessary to interconnect various functions from various circuit cards to each other. In order to provide the necessary interconnection between circuit cards and their associated functions, the circuit cards 12 are inserted into the enclosure 10. The enclosure 10 has a back panel 20 which has attached to its shelf connectors 22. The shelf connectors 22 have a series of electrically conductive receptacles (not shown) which are adapted to engage the pins of the card connector 16. The receptacles of the shelf connectors 22 extend through the shelf connectors 22, protrude from the back panel 20 and terminate in solid elongated binding posts 26 (FIG. 2) thus providing an array of elongated binding posts. Each array of posts has a common space pattern, here shown as two vertical rows with predetermined horizontal spacing and with the posts in each row having a predetermined equal vertical spacing. The post arrays, in turn, have common units of spacing therebetween, i.e., equal horizontal spacing and equal vertical spacing.

The binding posts 26 are electrically conductive and square or rectangular in cross section. The square or rectangular cross section provides square corners extending along the length of the binding posts 26.

The circuit cards 12 are inserted into the shelf 10 by means of card guides located on the inner surfaces of the shelf. The card guides direct the card connector 16 into engagement with the shelf connector 22 so that the card connector pins and the shelf connector receptacles mate. The card guides also hold the card in place in the shelf. Once the card 12 is in place in the shelf 10 and the connectors 16 and 22 have mated together, the electrical function inputs and outputs as well as the power inputs to the card are connected via the connectors to the binding posts 26 at the back panel 20.

Therefore, in order to interconnect the various cards with their various functions to provide a complex electronic circuit system, the proper electrical interconnection is made between and among the binding posts at the back panel.

Figure 2:
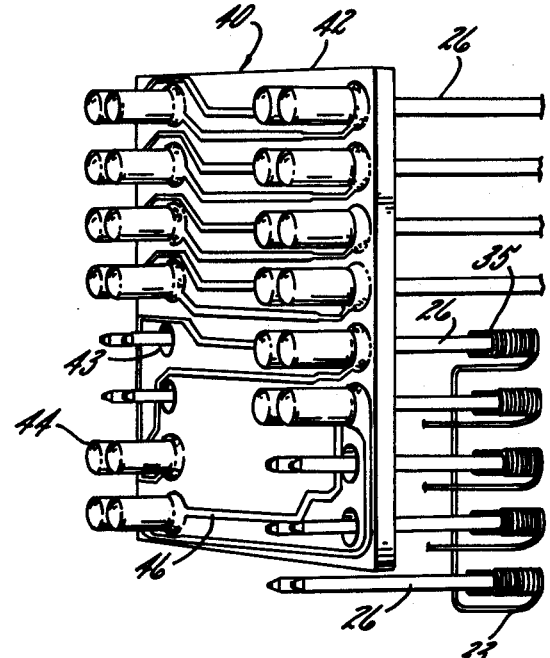
FIG. 2 is an enlarged perspective view of the program plug showing its attachment to the back panel binding posts.

As shown in FIGS. 1 and 2, the binding posts can be connected by wrapping one end of a wire, for example 33, around square binding post 26 and the other end of the wire being connected to another binding post. Wire wrapping is well known in the art and is accomplished by means of a special tool which tightly wraps the wire onto the square cornered binding posts so that the square corners of the binding posts are slightly deformed (at 35 in cutaway section) to provide a secure mechanical as well as electrical connection between the wire and the post. Because of the secure connection created by the deformities in the binding posts, it is difficult to simply pull the wire off the binding post. Therefore, the wire wrapped connection is a semi-permanent connection which can only be removed by unwrapping the wire in order for the wire to pass over the deformities created in the square binding post.

In order to provide a temporary interconnection between binding posts at the back panel, a program plug 40 is provided and is best seen in FIG. 2. The program plug comprises a circuit board 42 that is of sufficient size to span at least two shelf connectors 22. Holes 43 are provided in board 42 and sockets 44 are inserted into the holes and soldered or pressed in place. The holes are drilled in the circuit board 42 so as to align with the binding posts 26 extending from two or more of the shelf connectors 22. As here shown, two spaced arrays of holes at opposite end regions of the board 42 receive sockets 44, although the sockets are omitted from those particular holes corresponding to those binding posts to which no connection is required. Each array of holes has the same space pattern as an array, or a partial array, of the binding posts. The two arrays of sockets also have the same common unit spacing (here, in a horizontal direction) as that between the binding post arrays. Thus, the sockets slip with frictional fit over the posts of two respective connectors 22 (see FIG. 1) to establish post-to-socket connections and to physically retain the plug 10 in place on the back panel. The board 40 is initially formed with printed circuit conductive ribbons 46 extending between different predetermined holes, as determined by the desired post-to-post electrical connections, and the soldering or pressing of each socket 44 in place creates an electrical connection to the adjacent ribbon.

Figure 3:
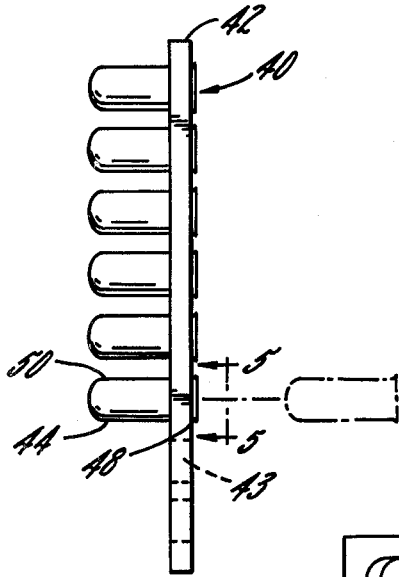
FIG. 3 is an elevated view of the program plug.
Figure 4:
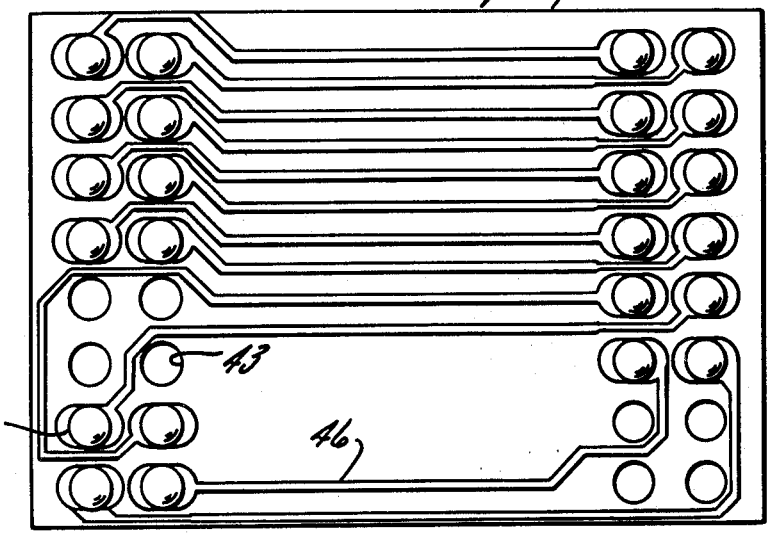
FIG. 4 is a plan view of the program plug.
Figure 5:
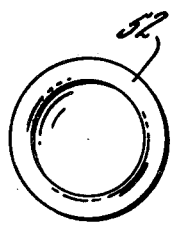
FIG. 5 is a detailed end view of the program plug's socket as seen along line 5—5 of FIG. 3.

The sockets 44 (as best seen in FIGS. 3 and 5) consist of an eyelet portion 48 and a hollow barrel portion 50. The barrel portion 50 is manufactured of a spring material, such as beryllium copper, and has an inner diameter 52 which allows the socket 44 to be slipped over one of the binding posts 26 and provide secure, resilient, electrical contact with the binding posts 26.

The layout of the printed circuit ribbons on any particular board can be changed to accommodate other electrical functions from a "post-to-post" chart made by an engineer to designate the connections which are desired. It is a simple matter thereafter to mount and fix the sockets 44 in the proper holes, and any connection designated as optional may be left incomplete by omitting the socket at one end of the ribbon which forms that connection. Once the sockets have been mounted into the circuit board and pressed or soldered into place to engage the printed circuit ribbons, the program plug 40 is pushed onto the binding posts of two connectors 22 at the back panel so that the sockets slidably and resiliently engage the binding posts and thereby provide an electrical connection between the binding posts.

By different layouts of the printed circuit ribbons, a multiplicity of program plugs can be provided for use in making different ones of several temporary back panel interconnections. In this way, temporary connections needed during testing and startup of a complex system are easily established by substitution of different program plugs on the posts of any pair of circuit board connectors 22. By interconnecting two adjacent circuit cards, a card pair may be used to mount all of the components of an identifiable single function electronic circuit. Finally, by use of the program plug, updating an overall system may be achieved by simply removing one program plug and inserting another to change functions as the user's requirements vary.

Once a given program plug has been constructed, the fixed interconnection provided by the printed circuitry thereon eliminates the possibility of point to point wiring errors which might result using other means of making temporary interconnections.

It should also be appreciated that program plugs can be increased in length to span more than two adjacent shelf connectors, with an array of holes and sockets located to register with the posts for several vertically or horizontally spaced sets of shelf connectors. In this way, three, four and a greater number of cards may be interconnected by pressing a single program plug onto those posts.

We claim:

1. In a circuit card shelf, which shelf has a plurality of shelf connectors each having an array of binding posts extending therefrom in a common space pattern with the arrays having common units of spacing therebetween, the combination comprising a program plug non-permanently interconnecting the array of binding posts comprising:
   a. circuit board,
   b. a plurality of arrays of conductive sockets of spring material affixed to the circuit board, each socket array spaced to match the common space pattern array of binding said sockets thereby being pressed onto the binding posts of a plurality of shelf connectors and slidably and resiliently engaging the binding posts, and c. printed circuitry on the circuit board electrically interconnecting predetermined ones of the sockets and thereby establishing a desired pattern of interconnections between the array of binding posts.

2. The program plug of claim 1, wherein the circuit board spans at least two shelf connectors of the circuit card shelf.

* * * * *